United States Patent [19]
Kusaka et al.

[11] Patent Number: 5,896,006
[45] Date of Patent: Apr. 20, 1999

[54] ORGANIC THIN FILM LIGHT-EMITTING DEVICE HAVING SECOND ELECTRODES LAYER COVERING PERIPHERY OF FIRST ELECTRODES LAYER

[75] Inventors: Teruo Kusaka; Taizo Tanaka, both of Tokyo, Japan

[73] Assignee: NEC Corporation, Japan

[21] Appl. No.: 08/938,294

[22] Filed: Sep. 26, 1997

[30] Foreign Application Priority Data

Sep. 27, 1996 [JP] Japan ................................. 8-257185

[51] Int. Cl.$^6$ ........................................ M01J 1/62
[52] U.S. Cl. ..................... 313/506; 313/500; 313/505; 313/512
[58] Field of Search ........................ 313/500, 501, 313/503, 505, 506, 512

[56] References Cited

FOREIGN PATENT DOCUMENTS

| 3-233891 | 10/1991 | Japan . |
| 4-19993 | 1/1992 | Japan . |
| 4-51494 | 2/1992 | Japan . |
| 4-363896 | 12/1992 | Japan . |

*Primary Examiner*—Vip Patel
*Attorney, Agent, or Firm*—Ostrolenk,Faber,Gerb & Soffen, LLP

[57] ABSTRACT

Metal electrodes (cathode) are made from a plurality of materials wherein they are not simply superposed one another along the sectional direction, but the metal electrodes (cathode) are in contact with an organic thin film in such that they exhibit a difference in magnitude of work functions dependent upon their disposed positions in the plane. More specifically, a local metal electrode being in contact with the organic thin film inside a light-emitting device in the plane is formed from a material having a small work function, while the peripheral metal electrode which encloses the local metal electrode, wiring sections other than the light-emitting device and the like are formed from materials each having a lager work function than that of the local metal electrode.

4 Claims, 9 Drawing Sheets

ORGANIC THIN FILM LIGHT-EMITTING DEVICE HAVING SECOND ELECTRODES LAYER COVERING PERIPHERY OF FIRST ELECTRODES LAYER

FIELD OF THE INVENTION

The present invention relates to an electric field (electroluminescense) light-emitting device, a method for fabricating the same, and a display panel using the electric field light-emitting device, and more particularly to an organic thin film electric field light-emitting device suitable for use in a display panel, a method for fabricating the same, and a display panel using the organic thin film electric field light-emitting device.

BACKGROUND OF THE INVENTION

A so-called organic thin film electric field light-emitting device is such a device wherein excitation arises as a result of recombination of electrons and holes injected from a pair of electrodes, the resulting excitation emits light in the process of radial deactivation, and the light is radiated towards the outside through a transparent electrode and a glass substrate. In such an electric field light-emitting device, it is required that injection of carriers should be controlled towards the inside of the electric field light-emitting device.

A first conventional electric field light-emitting device is disclosed in the Japanese Patent Kokai No. 4-51494. In this electric field light-emitting device, the surface of a transparent electrode formed on a glass substrate is covered with an insulating film except for a portion for injecting carriers thereby to avoid unnecessary injection of the carriers. More specifically, after forming the transparent electrode, the whole surface of which is covered with the insulating film such as SiO2 film and the like in accordance with chemical vapor deposition (CVD) method or sputtering method, an aperture is defined on the insulating film by locally etching a portion corresponding to that for injecting carriers for light-emitting device in accordance with photolithographic process, and then an organic thin film (hole transportation layer and light-emitting layer) and a metal electrode are formed thereon.

A second conventional electric field light-emitting device is disclosed in the Japanese Patent Kokai N. 3-233891. In this electric field light-emitting device, a light-emitting layer is formed in an island-shape so as to separate from the other elements, respectively. The fabricating method therefor is such that a hole transportation layer is formed on a transparent electrode by means of vapor deposition method or the like, and thereafter a light-emitting layer is locally deposited to form the same by, for example, shadow mask method. Then, a metal electrode is formed by the use of another pattern mask in accordance with shadow mask method.

A third conventional electric field light-emitting device is disclosed in the Japanese Patent Kokai Nos. 4-19993 and 4-363896. In this electric field light-emitting device, a metal electrode is formed from a plurality of materials. A substrate metal electrode which has been prepared by utilizing a material and a process for providing good adhesion is disposed between the surface of an organic thin film composed of a hole transportation layer and a light-emitting layer and the metal electrode. The reason for disposing the substrate metal electrode is in improvements in adherent properties between the metal electrode and the organic thin film and in injection characteristic properties of carriers, so that the substrate metal electrode is formed on the whole surface of the underside of the metal electrode.

In the first to third conventional electric field light-emitting devices, however, there are disadvantages as explained below.

Although the first conventional electric field light-emitting device achieves an object for injecting carriers inside the electric field light-emitting device, it requires an expensive production facilities for CVD method (or sputtering method) and for photolithographic process, besides it utilizes expensive process steps (the number of steps is remarkable), so that this conventional electric field light-emitting device becomes expensive from economical point of view.

In the second conventional electric field light-emitting device, it is difficult to work the light-emitting layer so that stability in the fabrication process is deficient, besides since the light-emitting layer which is a major stage for light emission must be worked in a poor state of controllability, the device properties are also unstable.

In the third conventional electric field light-emitting device, although the two-layered metal electrodes are employed, since the upper and lower metal electrodes have an identical size with each other, electrons injected from an end of the electrodes spread to affect adjacent light-emitting devices, whereby there arises a problem of cross talk.

SUMMARY OF THE INVENTION

Accordingly, an object of the present invention is to provide an electric field light-emitting device, a method for fabricating the same, and a display panel using the electric field light-emitting device wherein the fabrication processes and the device properties are stable, the cost therefor is inexpensive, and the problem of cross talk is eliminated.

According to the first feature of the invention, an organic thin film electric field light-emitting device, comprises:

a transparent electrode formed on a first surface of an organic thin film;

metal electrodes of first and second layers formed on a second surface of said organic thin film; and a light-emitting region formed in said organic thin film, into which carriers are injected from said transparent electrode and said metal electrodes of said first and second layers to emit lights;

wherein the whole periphery of said metal electrode of said first layer is covered on said organic thin film by said metal electrode of said second layer, and is smaller in work function than said metal electrode of said second layer.

According to the second feature of the invention, a method for fabricating an organic thin film electric field light-emitting device, comprises the steps of:

forming a transparent electrode on the major surface of a transparent substrate, forming an organic thin film on said major surface of the transparent substrate and said transparent electrode, and forming metal electrodes of first and second layers in accordance with shadow mask method, wherein the step of forming said metal electrodes of said first and second layers, comprising the steps of:

setting two pattern masks in a superposed state by employing a first pattern mask for said metal electrode of the first layer and a second pattern mask for said metal electrode of the second layer, forming first said metal electrode of said first layer with the use of the first pattern mask, removing thereafter said first pattern mask for said metal electrode of the first layer without damaging vacuum, and forming succeedingly said metal electrode of said second layer with the use of the second pattern mask.

According to the third feature of the invention, a display panel, comprises:

a plurality of organic thin film electric field light-emitting devices arranged in a predetermined pattern; wherein each of said plurality of organic thin film electric field light-emitting devices, comprises:

a transparent electrode formed on a first surface of an organic thin film;

metal electrodes of first and second layers formed on a second surface of said organic thin film; and a light-emitting region formed in said organic thin film, into which carriers are injected from said transparent electrode and said metal electrodes of said first and second layers to emit lights;

wherein the whole periphery of said metal electrode of said first layer is covered on said organic thin film by said metal electrode of said second layer, and is small in work function than said metal electrode of said second layer.

BRIEF DESCRIPTION OF THE DRAWINGS

The invention will be explained in more detail in conjunction with the appended drawings, wherein.

DESCRIPTION OF THE PRIOR ART

Before explaining an organic thin film electric field light-emitting device, the aforementioned first to third conventional electric field light-emitting devices will be explained in FIGS. 1A and 1B to FIG. 3.

Figure 1A:
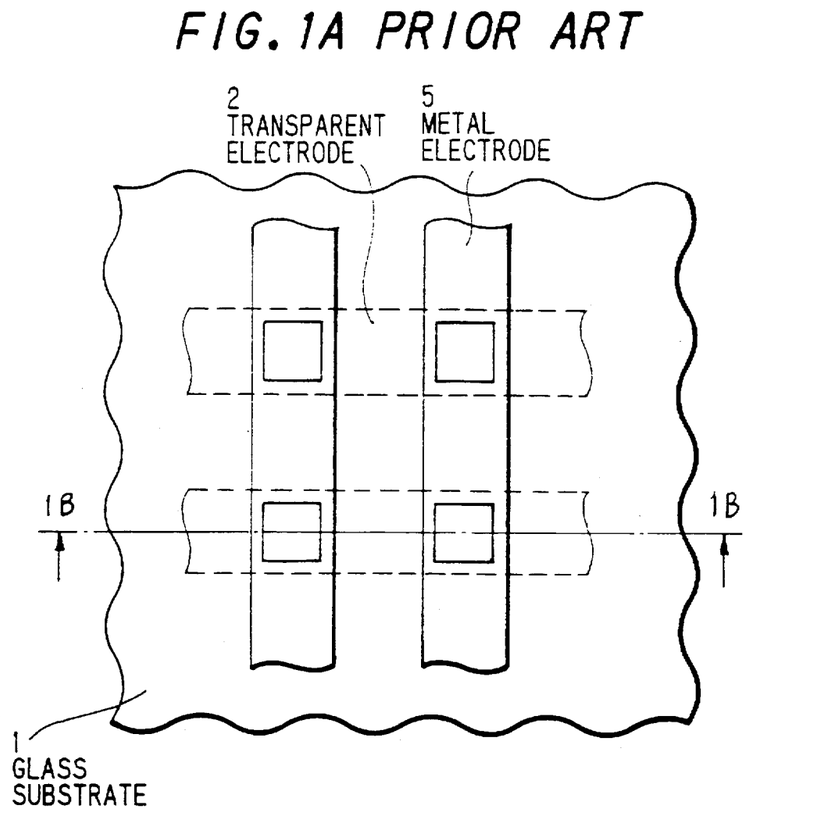
FIG. 1A is a plan view showing the first conventional electric field light-emitting device wherein injection of carriers is controlled towards the interior of the light-emitting device.
Figure 1B:
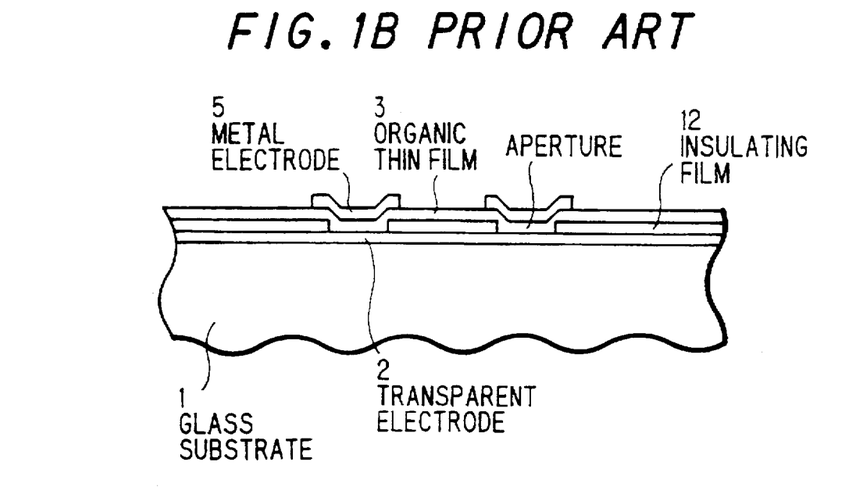
FIG. 1B is a sectional view taken along the line B–B' of FIG. 1A.

FIGS. 1A and 1B show the first conventional electric field light-emitting device, in which the surface of a transparent electrode 2 formed on a glass substrate 1 is covered with an insulating film 12 except for a portion for injecting carriers thereby to prevent from unnecessary injection of the carriers. More specifically, after forming the transparent electrode 2, the whole surface of which is covered with the insulating film 12 such as $SiO_2$ film and the like in accordance with chemical vapor deposition (CVD) method or sputtering method, an aperture is defined on the insulating film by locally etching a portion corresponding to that for injecting carriers for light-emitting device in accordance with photolithographic process, and then an organic thin film 3 (hole transportation layer and light-emitting layer) and a metal electrode 5 are formed thereon.

Figure 2A:
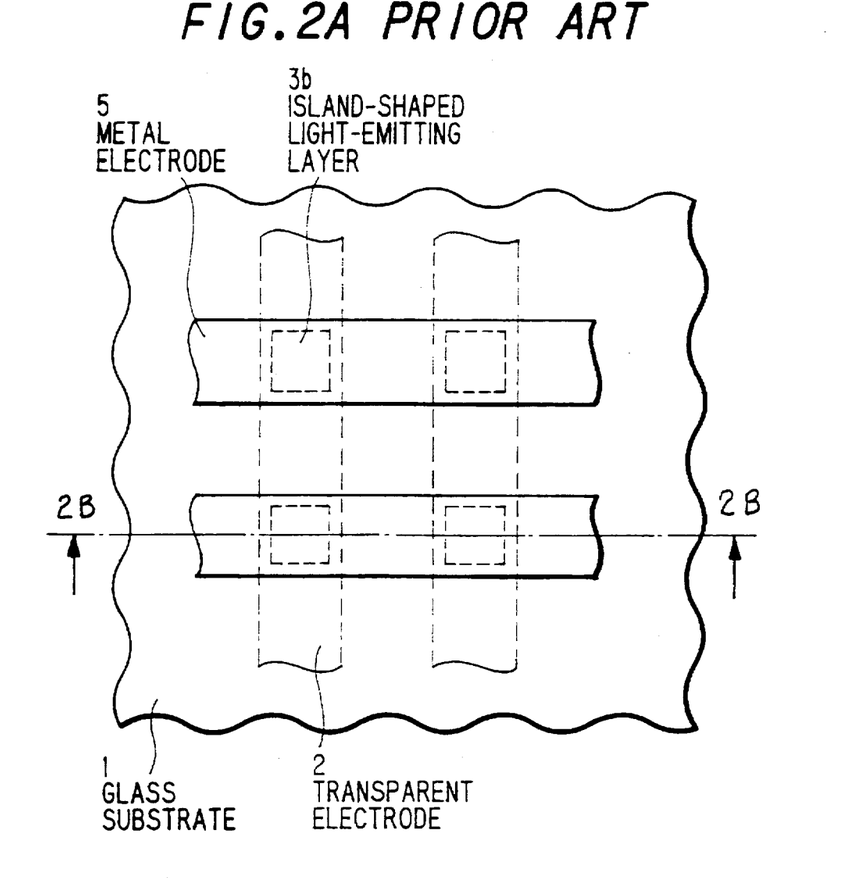
FIG. 2A is a plan view showing the second conventional electric field light-emitting device.
Figure 2B:
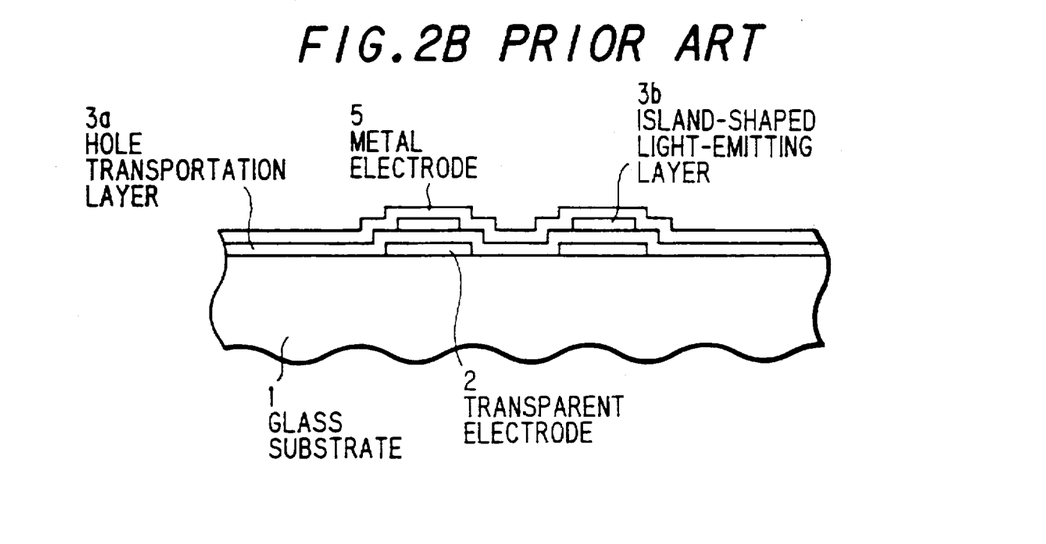
FIG. 2B is a sectional view taken along the line C–C' of FIG. 2A.

FIGS. 2A and 2B show the second conventional electric field light-emitting device, in which a light-emitting layer 3b is formed in an island-shape so as to separate from the other elements, respectively. The fabricating method therefor is such that a hole transportation layer 3a is formed on a transparent electrode 2 by means of vapor deposition method or the like, and thereafter the light-emitting layer 3b is locally deposited to form the same by, for example, shadow mask method. Then, a metal electrode 5 is formed by the use of another pattern mask in accordance with shadow mask method.

Figure 3:
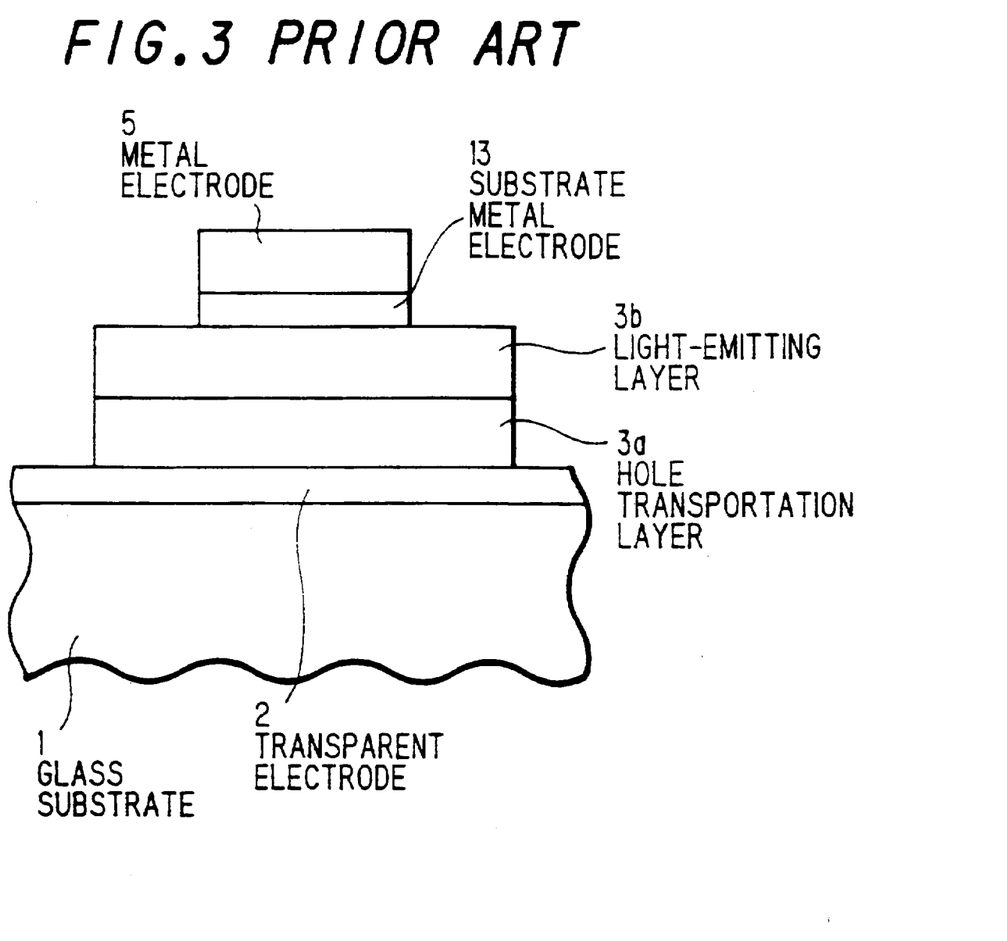
FIG. 3 is a sectional view showing the third conventional electric field light-emitting device wherein a metal electrode is formed of two types of materials.

FIG. 3 shows the third conventional electric field light-emitting device, in which a metal electrode is formed from a plurality of materials. A substrate metal electrode 13 which has been prepared by utilizing a material and a process for providing good adhesion is disposed between the surface of an organic thin film composed of a hole transportation layer 3a and a light-emitting layer 3b and the metal electrode 5. The reason for disposing the substrate metal electrode 13 is in improvements in adherent properties between the metal electrode 5 and the organic thin film and in injection characteristic properties of carriers, so that the substrate metal electrode 13 is formed on the whole surface of the underside of the metal electrode 5.

DESCRIPTION OF THE PREFERRED EMBODIMENTS

Next, an organic thin film electric field light-emitting device in the first preferred embodiment according to the present invention will be explained in FIGS. 4A and 4B. In this light-emitting device, on the major surface of a glass substrate 1, a transparent electrode 2 made of a transparent metal is formed, an organic thin film 3 composed of a hole transportation layer, a light-emitting layer, and an electron transportation layer is formed thereon, a local metal electrode 4 having an equal or smaller size than that of the light-emitting device in its plane is further formed thereon from a metallic material having a small work function, and a metal electrode 5 having a larger size than that of the local metal electrode 4 so that the periphery of which extends over the contours of the local metal electrode is formed thereon from a metallic material having a larger work function than that of the local metal electrode 4. In other words, the local metal electrode 4 is completely covered with the metal electrode 5 in its plane as shown in FIG. 4A.

In more detail, on the major surface of the glass substrate 1 having a thickness of 1 to 3 mm, the transparent electrodes 2 each having a film thickness of 0.05 to 0.200 mm which are prepared by the use of, for example, ITO or the like are subjected to pattern working in a striped state, for instance, they are each formed with 0.1 to 1.5 mm pitch in the X-axial direction. In such pattern working, first, typically ITO is formed on the whole surface of the glass substrate 1 by means of sputtering method, the transparent electrodes 2 are formed thereon by means of photolithography and chemical etching. The organic thin film 3 having a film thickness of 0.05 to 0.250 mm is formed thereon typically by means of vapor deposition method. Then, the local metal electrodes 4 are formed from a material having a small work function such as, typically, lithium or aluminum to which had been added lithium by the use of a pattern mask containing 0.03 mm square to 0.180 mm square openings in accordance with shadow mask method.

Furthermore, the metal electrodes 5 each having a thickness of 0.1 to 1.0 mm are formed thereon in a striped state with 0.1 to 1.5 mm pitch so as to intersect with the transparent electrodes 2, for example, in the Y-axial direction by means of vapor deposition in accordance with shadow mask method as described above. The metal used in this case is a material having a larger work function than that of the local metal electrode 4 such as aluminum. Each positional relationship in its plane is, as shown in FIG. 4A, such that each metal electrode 5 has a larger size than that of each local metal electrode 4, so that the former covers the latter together with the periphery thereof. A width of the peripheral portion to be covered is typically around 0.1 to 0.5 mm. The width is not specifically defined in view of characteristic properties of the light-emitting device, but it is decided by utilizing a precision in superposition of the local metal electrode 4 and the metal electrode 5 as the basis, and affording a margin thereto thereby making the width to be within the above described range.

Figure 4A:
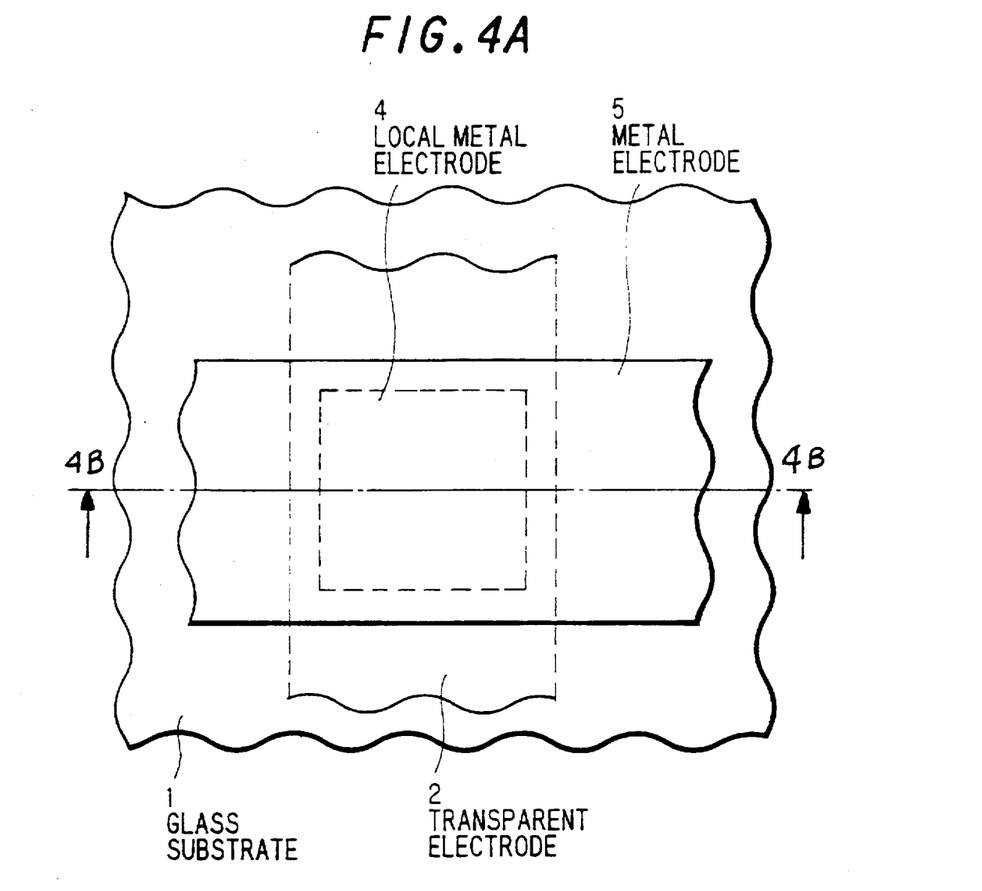
FIG. 4A is a plan view illustrating the first preferred embodiment of the present invention.
Figure 4B:
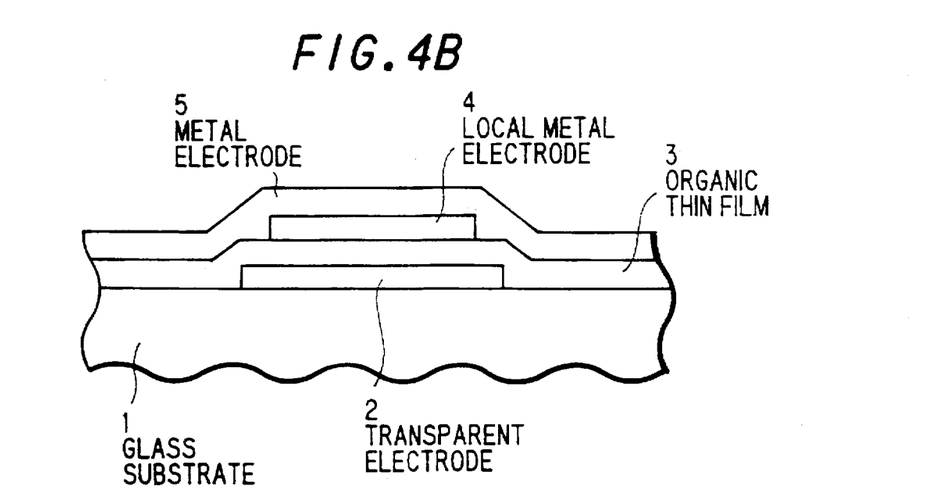
FIG. 4B is a sectional view taken along the line A–A' of FIG. 4A.
Figure 5:
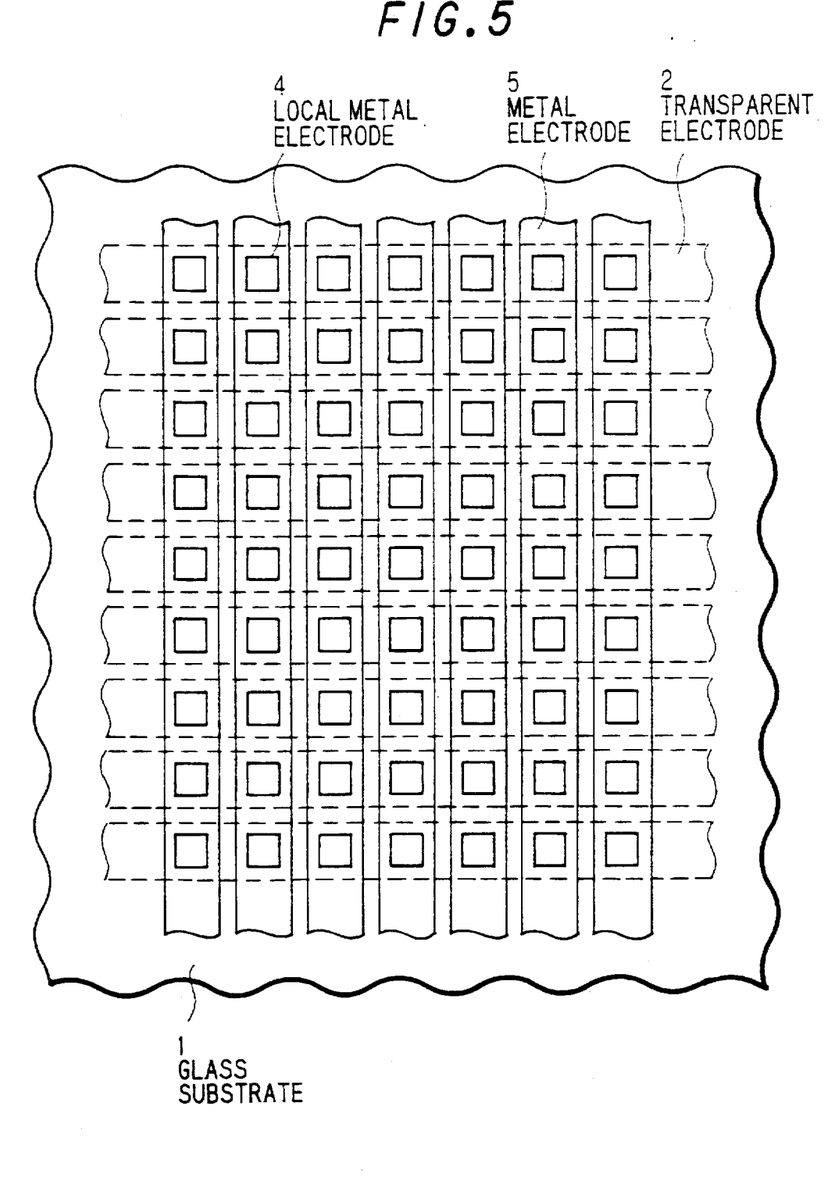
FIG. 5 is a plan view showing a part of a display panel fabricated from the N-row and M-column organic thin film electric field light-emitting devices according to the present invention shown in FIGS. 4A and 4B as the picture elements.

As shown in FIG. 5, M column x N row number of light-emitting devices are formed at the intersections defined by striped transparent electrodes 2 in the x-axial direction and striped metal electrodes 5 in the Y-axial direction wherein the light-emitting device shown in FIGS. 4A and 4B is employed as a single picture element. As a result, a display panel displaying prescribed patterns with the use of these light-emitting devices by scanning and driving simultaneously either the transparent electrodes 2 or the metal electrodes 5, or both of them is obtained.

Figure 6:
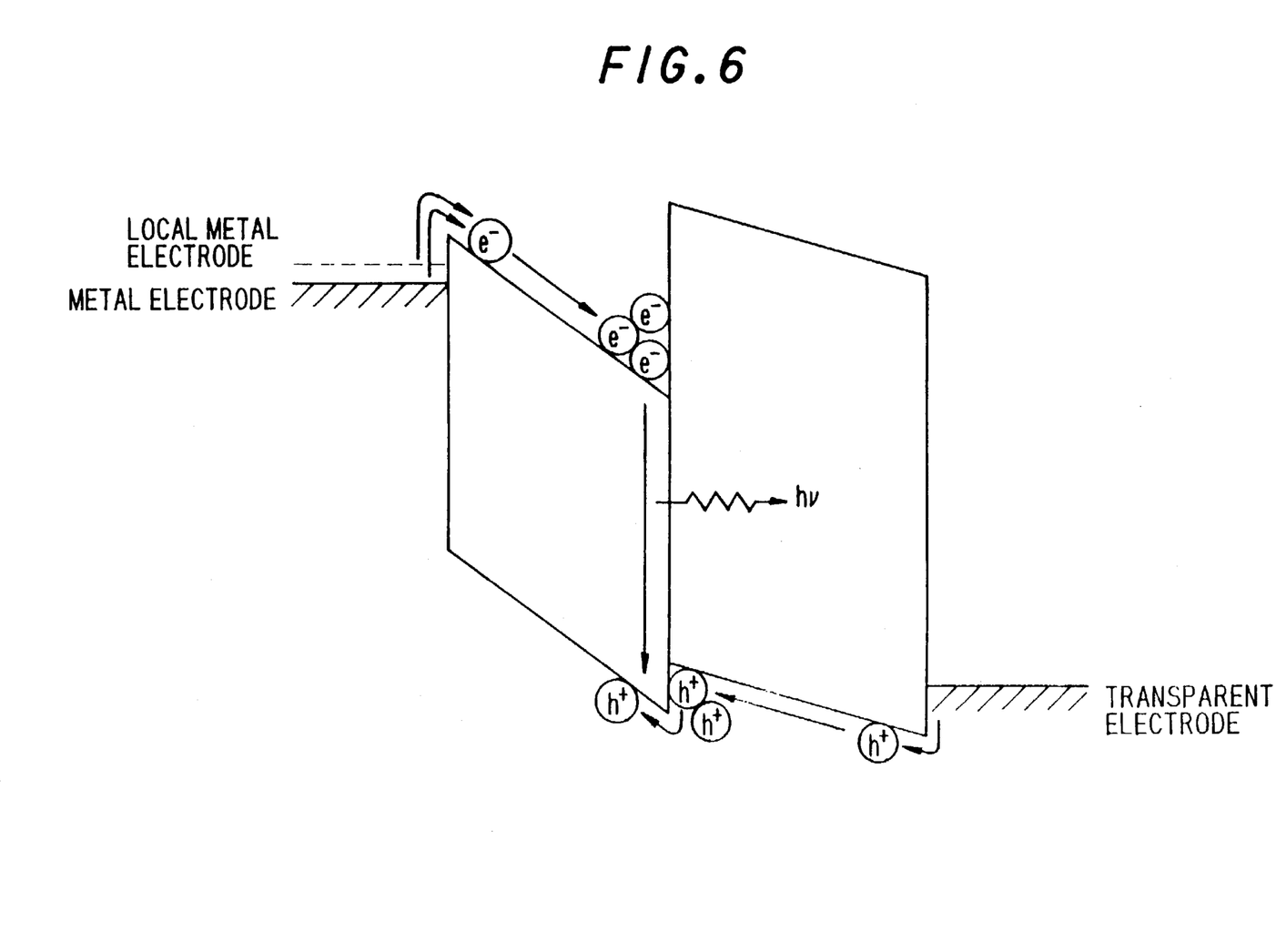
FIG. 6 is an energy diagram for explaining the functions and advantages of the present invention.
Figure 7:
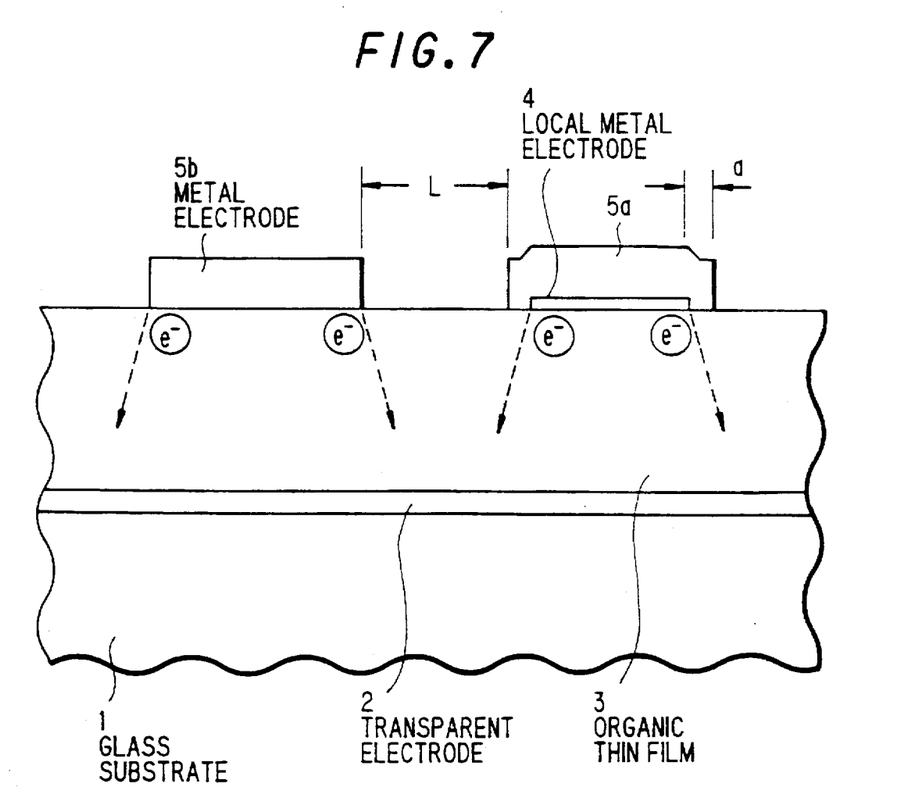
FIG. 7 is a sectional view for explaining the reason for improving a problem of cross talk.

As described above, in the manner of practice of the present invention, the electrode of a two-layered structure is disposed in such that the local metal electrode 4 having a small (low) work function is covered with the metal electrode 5 having a large (high) work function. For this reason, light emission is made at the central portion of the light-emitting device, so that cross talk which occurs among the light-emitting devices is improved. The reason of the improvement will be described by referring to FIGS. 6 and 7 wherein FIG. 6 is a schematically illustrated energy diagram of an organic thin film electric field light-emitting device. As is apparent from FIG. 6, when a material having a low work function is used, carriers (electrons) are more easily injected from the metal electrode (cathode). In other words, the height of a barrier becomes low. In a conventional light-emitting device, concentration of electric field produces at edges of an electrode, so that under the usual situation, carriers are first injected into not the central portion, but the peripheral portion of the light-emitting device as shown in the side of the metal electrode 5b in FIG. 7, and then the carriers diffuse towards surroundings. Under the circumstances, there is frequently such a case where the carriers injected from the peripheral portion get mixed with adjacent light-emitting devices. Namely, this means the occurrence of cross talk. According to the present manner of practice, the height of a barrier for injecting carriers is lower than that of the local metal electrode 4 as shown on the side of the metal electrode 5a in FIG. 7, because the local metal electrode 4 has a smaller work function than that of the metal electrode 5, so that injection of the carriers is started from the local metal electrode 4. As is apparent from FIG. 7, the carriers are injected into the central portion of a light-emitting device, whereby cross talk is improved in the present manner of practice.

Figure 8:
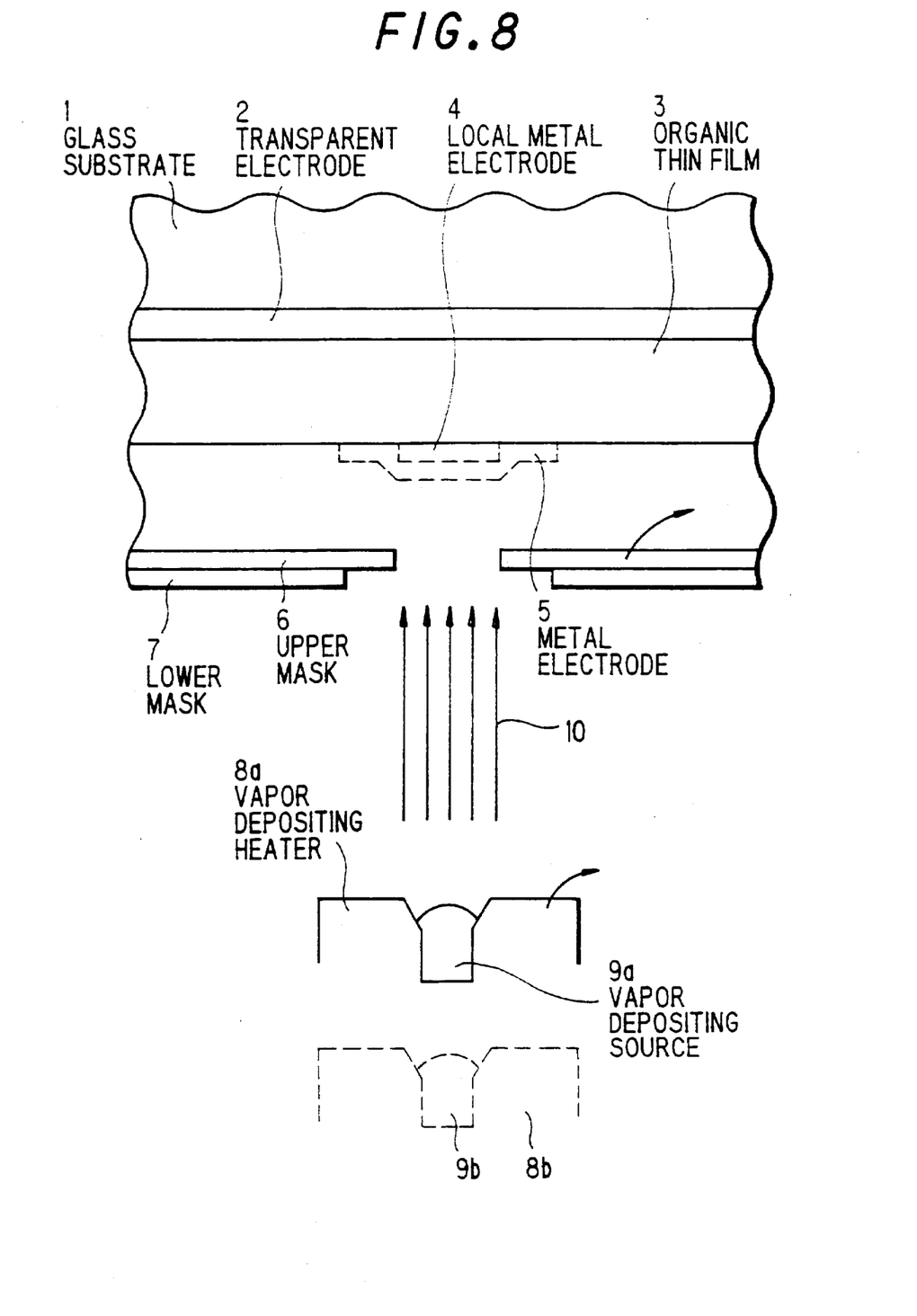
FIG. 8 is an explanatory view illustrating a local metal electrode in case of fabricating the organic thin film electric field light-emitting device and a method for fabricating the metal electrodes by shadow mask method in accordance with the present invention.

FIG. 8 is an explanatory view illustrating a method for fabricating an organic thin film electric field light-emitting device according to the present invention wherein a transparent electrode 2 is formed on a glass substrate 1, an organic thin film 3 is further formed thereon, and then the resulting substrate is set in a substrate holder of a vacuum metallizer (not shown). An upper mask 6 and a lower mask 7 in shadow mask method are set to a mask holder 7 (not shown) over the resulting glass substrate 1 wherein the upper mask 6 is a pattern mask for forming the local metal electrode 4, and the lower mask 7 is a pattern mask for forming the metal electrode 5. In the case when the upper mask 6 and the lower mask 7 are set to the mask holder, they are arranged in such that only the upper mask 6 can be removed without damaging the vacuum condition in the vacuum metallizing chamber. In a vapor depositing heater 8a, a vapor depositing source 9a for the local metal electrode 4 is disposed, while a vapor depositing source 9b for the metal electrode 5 is disposed in a vapor depositing heater 8b. Depositing vapor streams 10 derived from the vapor depositing sources 9a and 9b, respectively, form the local metal electrode 4 and the metal electrode 5 on the surface of the organic thin film 3 through the respective pattern masks.

Figure 9:
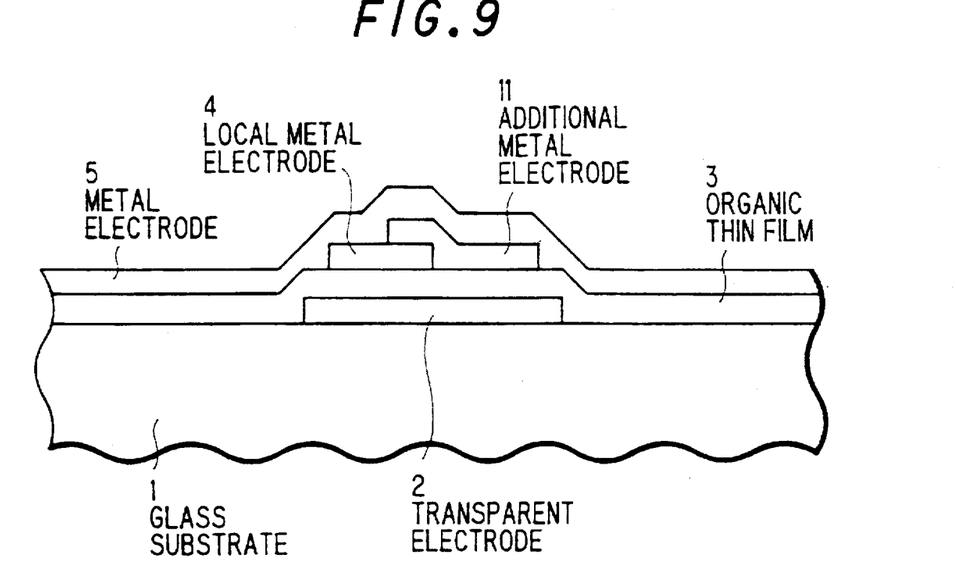
FIG. 9 is a sectional view illustrating the second preferred embodiment of the present invention.

Next, the second preferred embodiment according to the present invention will be described by referring to FIG. 9. In the second manner of practice, an additional metal electrode 11 is further disposed in addition to the local metal electrode 4, though one type of the local metal electrode 4 has been disposed in the first manner of practice. More specifically, for example, the local metal electrode 4 is made from lithium, and the additional metal electrode 11 is made from magnesium, or a work function of the local metal electrode 4 makes different from that of the additional metal electrode 11 by changing a concentration of lithium to be added to aluminum. In this case, materials each having a smaller work function than that of the metal electrode 5 are selected for both the local metal electrode 4 and the additional metal electrode 11, respectively. The additional metal electrode 11 is formed after forming the above-mentioned local metal electrode 4 in the first manner of practice by repeating the same process step. When a plurality of work functions are provided, a plurality of injection regions are formed in a single picture element by a single driving voltage. In other words, a plurality of luminances can be obtained in a single picture element, so that gradation is made to be smooth.

Figure 10:
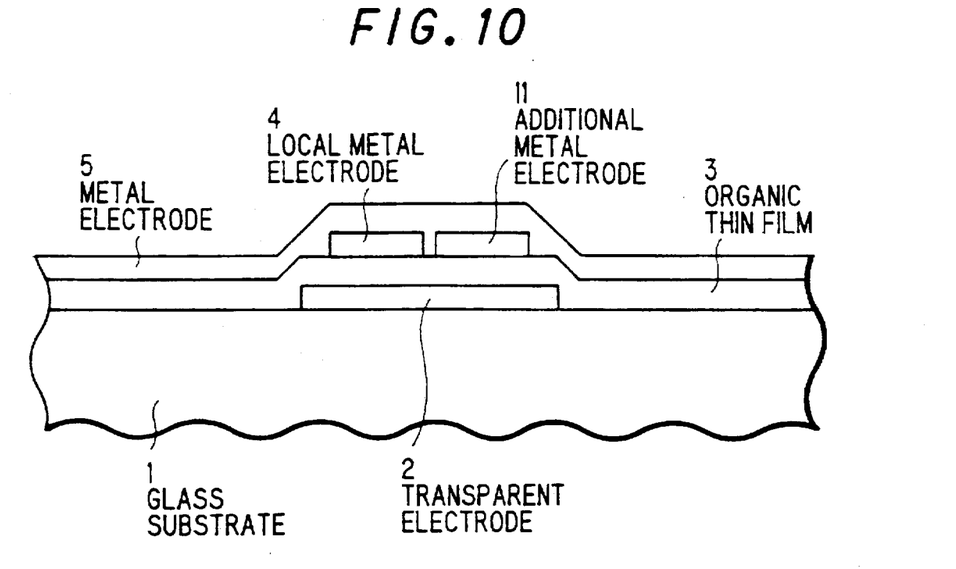
FIG. 10 is a sectional view illustrating the third preferred embodiment of the present invention.

FIG. 10 is a sectional view illustrating the third preferred embodiment according to the present invention which is the same as the second manner of practice except that a local metal electrode 4 is disposed in parallel to an additional metal electrode 11 in the present manner of practice, while the local metal electrode 4 and the additional metal electrode 11 are disposed in such that they are overlapped in their respective positions with each other in the second manner of practice.

The first advantageous effect according to the present invention is in that light emission comes to be effected at the central portion of a light-emitting device to improve separating characteristics (cross talk) among light-emitting devices, whereby patterns of high quality can be displayed.

The second advantageous effect according to the present invention is to improve luminous efficiency. The reason why the improvement is attained relates to the first advantage wherein injection of carriers from an electrode is concentrated in an internal region of a light-emitting device, i.e., the region which contributes to light emission. As a result, there is no injection of carriers towards useless direction.

The third advantageous effect according to the present invention is in its inexpensive manufacturing cost. This is because the present invention can be practiced by applying a piece of mask to vapor deposition in usual shadow mask method. In this case, it is possible to merely change the operation sequence in a vapor deposition process step, but not it requires expensive installation such as that for photolithography as well as expensive process steps in embodying the present invention.

The fourth advantageous effect according to the present invention is to obtain luminous intensity exhibiting a finer gradation. This is because two gradations can be expressed by a single driving voltage in a pictorial display according to the present invention, whereby a finer gradation can be expressed based on the advantageous effect of the present invention.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An organic thin film electric field light-emitting device, comprising:

a transparent electrode formed on a first surface of an organic thin film;

metal electrodes of first and second layers formed on a second surface of said organic thin film; and a light-emitting region formed in said organic thin film, into which carriers are injected from said transparent electrode and said metal electrodes of said first and second layers to emit lights;

wherein the whole periphery of said metal electrode of said first layer is covered on said organic thin film by said metal electrode of said second layer, and is smaller in work function than said metal electrode of said second layer.

2. The light-emitting device as defined in claim 1, wherein:

said metal electrode of said first layer is formed from two or more electrodes each having a different work function.

3. A display panel, comprising:

a plurality of organic thin film electric field light-emitting devices arranged in a predetermined pattern;

wherein each of said plurality of organic thin film electric field light-emitting devices, comprises:

a transparent electrode formed on a first surface of an organic thin film;

metal electrodes of first and second layers formed on a second surface of said organic thin film; and a light-emitting region formed in said organic thin film, into which carriers are injected from said transparent electrode and saidmetal electrodes of said first and second layers to emit lights;

wherein the whole periphery of said metal electrode of said first layer is covered on said organic thin film by said metal electrode of said second layer, and is small in work function than said metal electrode of said second layer.

4. The display panel as defined in claim 3, wherein:

said metal electrode of said first layer is formed from two more electrodes each having a different work function.

* * * * *